(12) United States Patent
Mishima et al.

(10) Patent No.: US 6,530,764 B2
(45) Date of Patent: Mar. 11, 2003

(54) MOLD FOR RESIN-SEALING OF SEMICONDUCTOR DEVICES

(75) Inventors: Yoshiyuki Mishima, Tokyo (JP); Tetsuya Hirose, Tokyo (JP); Hideji Aoki, Tokyo (JP); Hiromichi Yamada, Tokyo (JP); Toru Ueno, Tokyo (JP); Kiyoharu Kato, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 139 days.

(21) Appl. No.: 09/770,666

(22) Filed: Jan. 29, 2001

(65) Prior Publication Data

US 2002/0012716 A1 Jan. 31, 2002

(30) Foreign Application Priority Data

Jul. 25, 2000 (JP) ........................................ 2000-224049

(51) Int. Cl.⁷ ..................... B29C 45/14; B29C 45/40; B29C 70/72
(52) U.S. Cl. ................... 425/116; 425/116; 425/125; 425/544; 425/556; 425/437; 425/440; 425/443
(58) Field of Search ................... 264/272.15, 272.17; 425/116, 125, 127, 129.1, 544, 572, 588, 556, 440, 443, 437; 438/127

(56) References Cited

U.S. PATENT DOCUMENTS

| | | | |
|---|---|---|---|
| 2,658,237 A | * 11/1953 | Cuppett et al. | 425/440 |
| 3,050,807 A | * 8/1962 | Cieremans | 425/440 |
| 4,044,984 A | * 8/1977 | Shimizu et al. | 425/116 |
| 5,074,779 A | * 12/1991 | Tsutsumi et al. | 425/556 |
| 5,252,051 A | * 10/1993 | Miyamoto et al. | 264/272.17 |
| 5,484,274 A | * 1/1996 | Neu | 425/116 |
| 5,750,154 A | * 5/1998 | Maeda et al. | 264/272.17 |
| 5,753,538 A | * 5/1998 | Kuno et al. | 264/272.17 |
| 5,971,734 A | * 10/1999 | Moon | 264/272.17 |
| 5,997,798 A | * 12/1999 | Tetreault et al. | 425/116 |
| 6,344,162 B1 | * 2/2002 | Miyajima | 425/544 |

FOREIGN PATENT DOCUMENTS

| | | | | |
|---|---|---|---|---|
| JP | 01216817 A | * | 8/1989 | B29C/45/40 |
| JP | 02059309 A | * | 2/1990 | B29C/33/44 |
| JP | 09262876 A | * | 10/1997 | B29C/45/43 |
| JP | 11040593 A | * | 2/1999 | H01L/21/56 |
| JP | 2001079901 A | * | 3/2001 | B29C/45/40 |

* cited by examiner

Primary Examiner—Robert Davis
(74) Attorney, Agent, or Firm—Leydig, Voit & Mayer, Ltd.

(57) ABSTRACT

A resin-sealing mold for encapsulating a semiconductor device includes upper and lower molds with a first cavity insert forming a cavity side face portion; a first elastic post supporting the first cavity insert; an elastic plate, built in the first cavity insert, forming a cavity bottom portion; a second cavity insert embedded at a position adjacent to the elastic plate on the side opposite to the cavity; a second elastic post supporting the second cavity insert; a retainer including the first cavity insert and the second cavity insert; and a backing plate to which the first elastic post, the second elastic post and the retainer are attached. Generation of thin burrs that tend to appear on the periphery of the package and in the vicinity of the cull section is prevented, and, consequently, a resin-sealing mold with high reliability is produced.

17 Claims, 7 Drawing Sheets

(UPPER MOLD)

(LOWER MOLD)

MOLD FOR RESIN-SEALING OF SEMICONDUCTOR DEVICES

BACKGROUND OF THE INVENTION

1. Field of the Invention

The present invention relates to a resin-sealing mold for encapsulating a semiconductor device by sealing a semiconductor element in a molding resin, a method of encapsulating a semiconductor device in a resin using the resin-molding mold, and a method of releasing the resin-sealed semiconductor device from the mold.

2. Description of the Related Art

FIG. 7 is a cross-sectional view that shows a conventional resin-sealing mold of a semiconductor device. FIG. 8 is a cross-sectional view that shows a mold-releasing state of the conventional resin-sealing mold of a semiconductor device. In FIGS. 7 and 8, a semiconductor resin package 51 is formed as follows: A semiconductor element 22 is installed on a lead frame 21 with the semiconductor element 22 being connected to the lead frame 21 through a bonding wire 23, and this is sealed with mold resin 29 set on a plunger 30.

Moreover, the upper mold of the resin-sealing mold of semiconductor device is constituted by an upper-mold cavity insert 24a having a plurality of cavities 36a, a cull insert 26, an upper-mold retainer 27a including the upper cavity insert 24a and the cull insert 26, an elastic post 25 installed between an upper-mold backing plate 34a and the upper-mold retainer 27a, an eject pin 28, an eject rod 31 and an upper-mold frame 35a.

The eject pin 28 has one end sandwiched between an upper-mold ejector plate 32a and an upper-mold pressing plate 33a with the other end communicating with the upper-mold cavity 36a. Here, the eject pin 28 penetrates the upper-mold retainer 27a and the upper-mold cavity insert 24a. The eject rod 31 is attached to the upper-mold ejector plate 32a. The upper-mold frame 35a allows the upper-mold retainer 27a and the upper-mold backing plate 34a to engage each other.

Moreover, the lower mold of the resin-sealing mold of a semiconductor device is constituted by an lower-mold cavity insert 24b having a plurality of cavities 36b, a lower-mold retainer 27b that has a built-in chamber 11 and includes the lower-mold cavity insert 24b, an elastic post 25 installed between a lower-mold backing plate 34b and the lower-mold retainer 27b, an eject pin 28, an eject rod 31 and an lower-mold frame 35b.

The eject pin 28 has one end sandwiched between a lower-mold ejector plate 32b and a lower-mold pressing plate 33b with the other end communicating with the lower mold cavity 36b. Here, the eject pin 28 penetrates the lower-mold retainer 27b and the lower-mold cavity insert 24b. The eject rod 31 is attached to the lower-mold ejector plate 32b. The lower-mold frame 35b allows the lower-mold retainer 27b and the lower-mold backing plate 34b to engage each other. The plunger 30 and a molding resin 29 are placed inside the chamber 11. Next, an explanation will be given of a resin-sealing method of a semiconductor device. A frame assembly, which has a semiconductor element 22 and a bonding wire 23 attached to the lead frame 21, is arranged on the lower-mold cavity 36b of the lower-cavity insert 24b placed on the upper surface of the lower mold. Here, the upper and lower resin-sealing molds are preliminarily maintained at a high temperature by heaters, not shown.

Next, molding resin 29 is loaded into the chamber 11. The upper mold of the resin-sealing mold and the lower mold of the resin-sealing mold are clamped together so that the upper-mold cavity insert 24a and the lower-mold cavity insert 24b sandwich the lead frame 21. The plunger 30 is raised so that the molten molding resin 29 in the chamber 11 is injected into both of the upper-mold cavity 36a and the lower-mold cavity 36b through a runner 37. Thus, a semiconductor resin package 51, which is a resin-sealed semiconductor device, is formed.

Next, the semiconductor resin package 51 is maintained (cured) in this state for a predetermined time so as to be cured. Thereafter, the upper mold of the resin-sealing mold and the lower mold of the resin-sealing mold are opened, and the sequence proceeds to a mold-releasing process; however, the semiconductor resin package 51 is stuck to either the upper-mold cavity 36a or the lower-mold cavity 36b due to the adhering strength of its resin, with the result that it is difficult to release the package 51 from the mold.

Then, as the upper mold of the resin-sealing mold is raised, an upper-mold external driving means (not shown) pushes the eject rod 31 out. The eject rod 31, thus pushed out, allows the eject pin 28 attached to the ejector plate 32a to penetrate the retainer 27a and the cavity insert 24a, thereby pressing the upper face of the semiconductor resin package 51. The semiconductor resin package 51 has its upper face pushed by the eject pin 28, and is released from the upper mold of the resin-sealing mold.

Next, the external driving means (not shown) pushes the eject rod 31 out. The eject rod 31, thus pushed out, allows the eject pin 28 attached to the ejector plate 32b to penetrate the retainer 27b and the cavity insert 24b, thereby pressing the lower face of the semiconductor resin package 51. The semiconductor resin package 51 has its lower face pushed by the eject pin 28, and is released from the lower mold of the resin-sealing mold.

Since the conventional resin-sealing mold is arranged as described above, it requires a number of eject pins. The eject pin needs a great amount of time in its boring process with high precision and pin outer-diameter machining process, resulting in an increase in mold manufacturing costs and an lengthened manufacturing time. Moreover, because of limitations in the package designing, the resin-molding process has to be carried out with the tip of the eject pin protruding from the bottom face of the cavity in order to absorb dimensional errors of parts such as the cavity insert, retainer and eject pin; therefore, this structure tends to cause the inner semiconductor element, bonding wire and other parts to expose to the outside of a thin package that has been demanded in recent years. Furthermore, the conventional resin-sealing mold fails to absorb deviations in the frame thickness, causing burrs to be generated on the periphery of the semiconductor resin package and in the vicinity of the cull section.

SUMMARY OF THE INVENTION

The present invention has been devised to eliminate the above-mentioned problems, and its objective is to provide a resin-sealing mold for a semiconductor device which can reduce the molding costs and shorten manufacturing time as well as reduce damage to packages by eliminating a number of ejecting pins and having, consequently, a simplified structure. Moreover, another objective is to provide a resin-sealing mold for a semiconductor device which can accommodate deviations in the thickness of a lead frame and, consequently, eliminate thin burrs that tend to occur on the periphery of the semiconductor resin package and in the vicinity of a cull section. Furthermore, still another objective is to provide a method of resin-sealing a semiconductor device which is suitable for the resin-sealing mold. Still another objective is to provide a method of releasing a resin-sealed semiconductor device from the mold.

The present invention has been devised to achieve the above-mentioned objectives, and the resin-sealing mold of a semiconductor device of the first preferred mode of the present invention is provided with: two molds, that is, an upper mold and a lower mold, for resin-sealing a semiconductor device installed on a lead frame, the upper and lower molds forming a cavity, wherein: each of the upper and lower molds comprises: a first cavity insert for forming a cavity side face portion; a first elastic post for supporting the first cavity insert; an elastic plate, built in the first cavity insert, for forming a cavity bottom portion; a second cavity insert embedded at a position adjacent to the elastic plate on the side opposite to the cavity; a second elastic post for supporting the second cavity insert; a retainer including the first cavity insert and the second cavity insert; and a backing plate to which the first elastic post, the second elastic post and the retainer are attached, and either one of the upper mold and the lower mold comprises: a cull insert adjacent to the first cavity insert; and a third elastic post for supporting the cull insert, and the other comprises: a chamber embedded in the retainer.

In accordance with the resin-sealing mold of a semiconductor of the first preferred mode of the present invention, the molding process is free from adverse effects due to deviations in the frame thickness and varied precision in the individual molding parts, etc.; therefore, it is possible to completely prevent the generation of thin burrs. Consequently, it becomes possible to improve the quality, to provide stable mold-releasing and transporting processes, to increase the assembling operation rate, and also to improve the productivity.

The resin-sealing mold of a semiconductor device of the second preferred mode of the present invention, which relates to the resin-sealing mold of a semiconductor device of the first preferred mode, is characterized in that the first cavity insert and the second cavity insert are allowed to move independently from each other.

In accordance with the resin-sealing mold of a semiconductor of the second preferred mode of the present invention, the molding process is free from adverse effects due to deviations in the frame thickness and varied precision in the individual molding parts,. etc.; therefore, it is possible to completely prevent the generation of thin burrs. Consequently, it becomes possible to improve the quality, to provide stable mold-releasing and transporting processes, to increase the assembling operation rate, and also to improve the productivity.

The resin-sealing mold of a semiconductor device of the third preferred mode of the present invention, which relates to the resin-sealing mold of a semiconductor device of the first preferred mode, is characterized in that the first elastic post for supporting the first cavity insert has an amount of distortion that is greater than the amount of distortion of the second elastic post for supporting the second cavity insert.

In accordance with the resin-sealing mold of a semiconductor of the third preferred mode of the present invention, it becomes possible to easily carry out the mold-releasing process of the semiconductor resin-sealed package.

The resin-sealing mold of a semiconductor device of the fourth preferred mode of the present invention, which relates to the resin-sealing mold of a semiconductor device of the third preferred mode, is characterized in that upon clamping the molds, the first elastic post is first shortened, and the second elastic post is then shortened, and upon opening the molds, the second elastic post is first stopped from extending, and the first elastic post is then stopped from extending.

In accordance with the resin-sealing mold of a semiconductor of the fourth preferred mode of the present invention, it becomes possible to easily carry out the mold-releasing process of the semiconductor resin-sealed package.

The resin-sealing mold of a semiconductor device of the fifth preferred mode of the present invention, which relates to the resin-sealing mold of a semiconductor device of the first preferred mode, is characterized in that a semiconductor resin-sealing package is released from the mold by distorting the elastic plate.

In accordance with the resin-sealing mold of a semiconductor of the fifth preferred mode of the present invention, it becomes possible to carry out the mold-releasing process of the semiconductor resin-sealed package, without using the eject pins.

The resin-sealing mold of a semiconductor device of the sixth preferred mode of the present invention, which relates to the resin-sealing mold of a semiconductor device of the first preferred mode, is characterized in that: the upper mold has a piping sleeve for injecting compressed air to the elastic plate, and the elastic plate is distorted by the compressed air injected through the piping sleeve so that the semiconductor resin-sealing package is released from the mold.

In accordance with the resin-sealing mold of a semiconductor of the sixth preferred mode of the present invention, it becomes possible to carry out the mold-releasing process of the semiconductor resin-sealed package, without using the eject pins.

The resin-sealing mold of a semiconductor device of the seventh preferred mode of the present invention, which relates to the resin-sealing mold of a semiconductor device of the first preferred mode, is characterized in that: the chamber has a groove formed in an inner face thereof, and upon opening the molds, the cull insert and a resin inside the chamber are separated from each other by using the groove.

In accordance with the resin-sealing mold of a semiconductor of the seventh preferred mode of the present invention, it becomes possible to carry out the mold-releasing process by using a simple structure.

The resin-sealing mold of a semiconductor device of the eighth preferred mode of the present invention, which relates to the resin-sealing mold of a semiconductor device of the seventh preferred mode, is characterized in that: a plunger is installed in the chamber, and residual resin inside the chamber is separated from the mold by using the plunger.

In accordance with the resin-sealing mold of a semiconductor of the eighth preferred mode of the present invention, it becomes possible to carry out the mold-releasing process of residual resin by using a simple structure.

The resin-sealing mold of a semiconductor device of the ninth preferred mode of the present invention, which relates to the resin-sealing mold of a semiconductor device of the first preferred mode, is characterized in that the first cavity insert and the cull insert are allowed to move independently from each other.

In accordance with the resin-sealing mold of a semiconductor of the ninth preferred mode of the present invention, the molding process is free from adverse effects due to deviations in the frame thickness and varied precision in the individual molding parts, etc.; therefore, it is possible to completely prevent the generation of thin burrs. Consequently, it becomes possible to improve the quality, to provide stable mold-releasing and transporting processes, to increase the assembling operation rate, and also to improve the productivity.

The resin-sealing mold of a semiconductor device of the tenth preferred mode of the present invention, which relates to the resin-sealing mold of a semiconductor device of the first preferred mode, is characterized by comprising: a seal that is placed on either the lower face of the upper mold or the upper face of the lower mold; and a vacuum evacuation hole that allows the lower face of the upper mold or the upper face of the lower mold to communicate with the outside of the resin-sealing mold, wherein, on the way of descending, the upper mold is temporarily stopped so that a sealed space is formed between the lower face of the upper mold and the upper face of the lower mold by the seal, and after a vacuum evacuation has been operated in the sealed space through the vacuum evacuation hole, the mold clamping operation is carried out.

In accordance with the resin-sealing mold of a semiconductor of the tenth preferred mode of the present invention, since unnecessary gaps are eliminated, it is possible to completely prevent the generation of thin burrs.

The resin-sealing mold of a semiconductor device of the eleventh preferred mode of the present invention, which relates to the resin-sealing mold of a semiconductor device of the first preferred mode, is characterized in that: the lower mold comprises a positioning pin for positioning the lead frame and the upper mold comprises a build-in cleaning pin in a hole that serves as an escape hole for the positioning pin upon clamping the molds.

In accordance with the resin-sealing mold of a semiconductor of the eleventh preferred mode of the present invention, since unnecessary gaps are eliminated, it is possible to completely prevent the generation of thin burrs.

The resin-sealing mold of a semiconductor device of the twelfth preferred mode of the present invention, which relates to the resin-sealing mold of a semiconductor device of the first preferred mode, is characterized in that: each of the upper and lower molds has a piping sleeve for allowing the elastic plate to communicate with the outside of the resin-sealing mold, and the elastic plate is distorted by a vacuum evacuation through the piping sleeve and an injection of compressed air.

In accordance with the resin-sealing mold of a semiconductor of the twelfth preferred mode of the present invention, it becomes possible to carry out the mold-releasing process of the semiconductor resin-sealed package, without using the eject pins.

The resin-sealing mold of a semiconductor device of the thirteen preferred mode of the present invention, which relates to the resin-sealing mold of a semiconductor device of the first preferred mode, is characterized in that: the first cavity insert and the elastic plate have desired processed films on respective surfaces contacting the semiconductor resin package.

In accordance with the resin-sealing mold of a semiconductor of the thirteenth preferred mode of the present invention, a desired treatment film is placed on the surface of the mold so that it becomes possible to greatly improve the mold-releasing property and abrasion resistant property.

The resin-sealing mold of a semiconductor device of the fourteenth preferred mode of the present invention, which relates to the resin-sealing mold of a semiconductor device of the third preferred mode, is characterized in that: the lower mold has a piping sleeve for allowing the elastic plate to communicate with the outside of the resin-sealing mold, and the elastic plate is distorted by compressed air injected through the piping sleeve so that the semiconductor resin package is released from the mold.

In accordance with the resin-sealing mold of a semiconductor of the fourteenth preferred mode of the present invention, it becomes possible to carry out the mold-releasing process of the semiconductor resin-sealed package, without using the eject pins.

The resin-sealing mold of a semiconductor device of the fifteenth preferred mode of the present invention, which relates to the resin-sealing mold of a semiconductor device of the first preferred mode, is characterized in that: each of the upper and lower molds has a piping sleeve for allowing the elastic plate to communicate with the outside of the resin-sealing mold, and the elastic plate is distorted by compressed air injected through the piping sleeve so that the semiconductor resin package is released from the mold.

In accordance with the resin-sealing mold of a semiconductor of the fifteenth preferred mode of the present invention, it becomes possible to carry out the mold-releasing process of the semiconductor resin-sealed package, without using the eject pins.

The resin-sealing mold of a semiconductor device of the sixteenth preferred mode of the present invention is characterized by comprising: two molds, that is, an upper mold and a lower mold, for resin-sealing a semiconductor device installed on a lead frame, the upper and lower molds forming a cavity, wherein: each of the upper and lower molds comprises: a first cavity insert for forming a cavity side face portion; a first elastic post for supporting the first cavity insert; a second cavity insert for forming a cavity bottom portion; a second elastic post for supporting the second cavity insert; a retainer including the first cavity insert and the second cavity insert; and a backing plate to which the first elastic post, the second elastic post and the retainer are attached, and either one of the upper mold and the lower mold comprises: a cull insert adjacent to the first cavity insert; and a third elastic post for supporting the cull insert, and the other comprises: a chamber embedded in the retainer.

In accordance with the resin-sealing mold of a semiconductor of the sixteenth preferred mode of the present invention, the molding process is free from adverse effects due to deviations in the frame thickness and varied precision in the individual molding parts, etc.; therefore, it is possible to completely prevent the generation of thin burrs. Consequently, it becomes possible to improve the quality, to provide stable mold-releasing and transporting processes, to increase the assembling operation rate, and also to improve the productivity.

The resin-sealing mold of a semiconductor device of the seventeenth preferred mode of the present invention is characterized by comprising: two molds, that is, an upper mold and a lower mold, for resin-sealing a semiconductor device installed on a lead frame, the upper and lower molds forming a cavity, wherein: each of the upper and lower molds comprises: a first cavity insert for forming a cavity side face portion and a cavity bottom portion; a first elastic post for supporting the first cavity insert; a second cavity insert that is embedded, on a side opposite to the cavity, at a position adjacent to a thin portion forming the cavity bottom portion that is one portion of the first cavity insert; a second elastic post for supporting the second cavity insert; a retainer including the first cavity insert and the second cavity insert; and a backing plate to which the first elastic post, the second elastic post and the retainer are attached, and either one of the upper mold and the lower mold comprises: a cull insert adjacent to the first cavity insert; and a third elastic post for supporting the cull insert, and the other comprises: a chamber embedded in the retainer.

In accordance with the resin-sealing mold of a semiconductor of the seventeenth preferred mode of the present invention, the molding process is free from adverse effects due to deviations in the frame thickness and varied precision in the individual molding parts, etc.; therefore, it is possible to completely prevent the generation of thin burrs. Consequently, it becomes possible to improve the quality, to provide stable mold-releasing and transporting processes, to increase the assembling operation rate, and also to improve the productivity.

The resin-sealing method of a semiconductor device of the eighteenth preferred mode of the present invention uses the resin-sealing mold of a semiconductor device of any one of the first through seventeenth preferred modes.

In accordance with the resin-sealing mold of a semiconductor of the eighteenth preferred mode of the present invention, the molding process is free from adverse effects due to deviations in the frame thickness and varied precision in the individual molding parts, etc.; therefore, it is possible to completely prevent the generation of thin burrs. Consequently, it becomes possible to improve the quality, to provide stable mold-releasing and transporting processes, to increase the assembling operation rate, and also to improve the productivity.

The mold-releasing method of a resin-sealed semiconductor device of the nineteenth preferred mode of the present invention, which uses the resin-sealing mold of a semiconductor device relating to the first preferred mode, is characterized in that the elastic plate is distorted.

In accordance with the mold-releasing method of the resin-sealed semiconductor device of the nineteenth preferred mode of the present invention, it is possible to carry out the mold-releasing process with less damage to the package.

The mold-releasing method of a resin-sealed semiconductor device of the twentieth preferred mode of the present invention, which uses the resin-sealing mold of a semiconductor device relating to the twelfth preferred mode, is characterized in that upon opening the molds, a vacuum evacuation is operated on the elastic plate through the piping sleeve so that the upper mold is released, and compressed air is then injected to the elastic plate through the piping sleeve so that the lower mold is released.

In accordance with the resin-sealing mold of a semiconductor device of the twentieth preferred mode of the present invention, it is possible to carry out the mold-releasing process with less damage to the package.

The mold-releasing method of a resin-sealed semiconductor device of the twenty first preferred mode of the present invention, which uses the resin-sealing mold of a semiconductor device relating to the fifteenth preferred mode, is characterized in that: the pressure of the compressed air is detected, and when the pressure of the compressed air becomes not more than a predetermined value, the injection of the compressed air is stopped.

In accordance with the resin-sealing mold of a semiconductor device of the twenty first preferred mode of the present invention, it is possible to prevent the compressed air from contaminating the clean room.

DETAILED DESCRIPTION OF THE INVENTION

Embodiment 1

Figure 1:
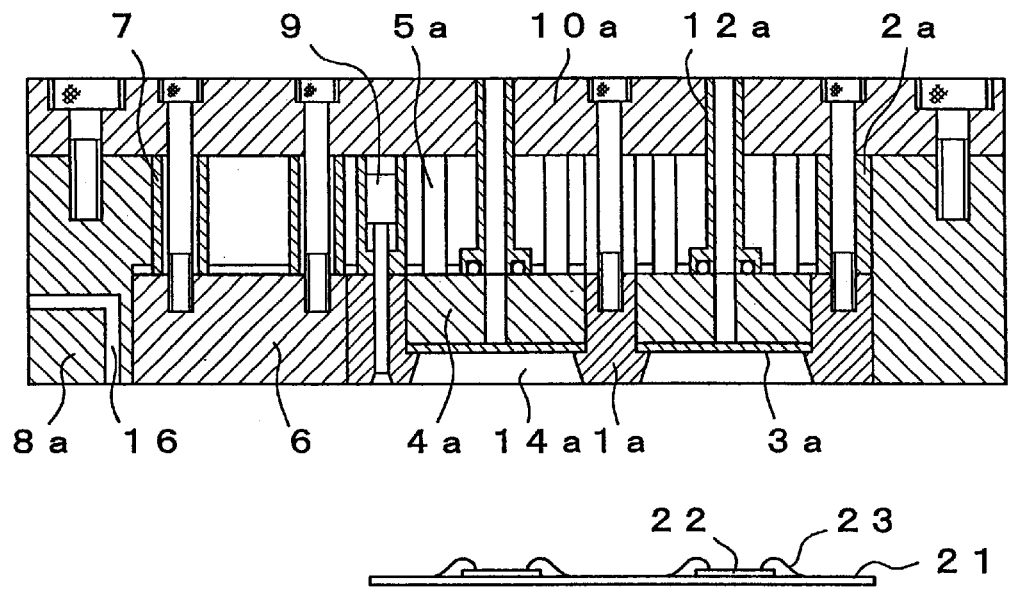
FIG. 1 is a cross-sectional view showing a resin-sealing mold in accordance with Embodiment 1 of the present invention.
Figure 1:
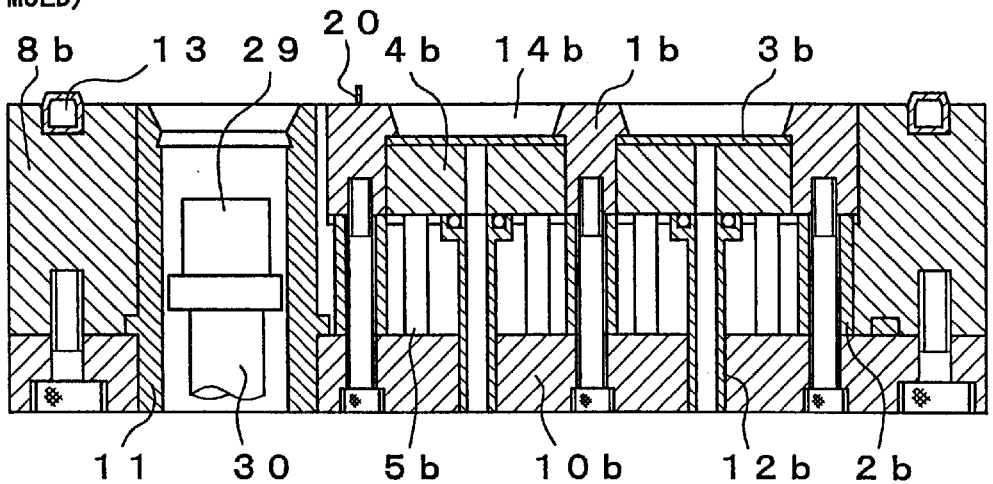
Figure 2:
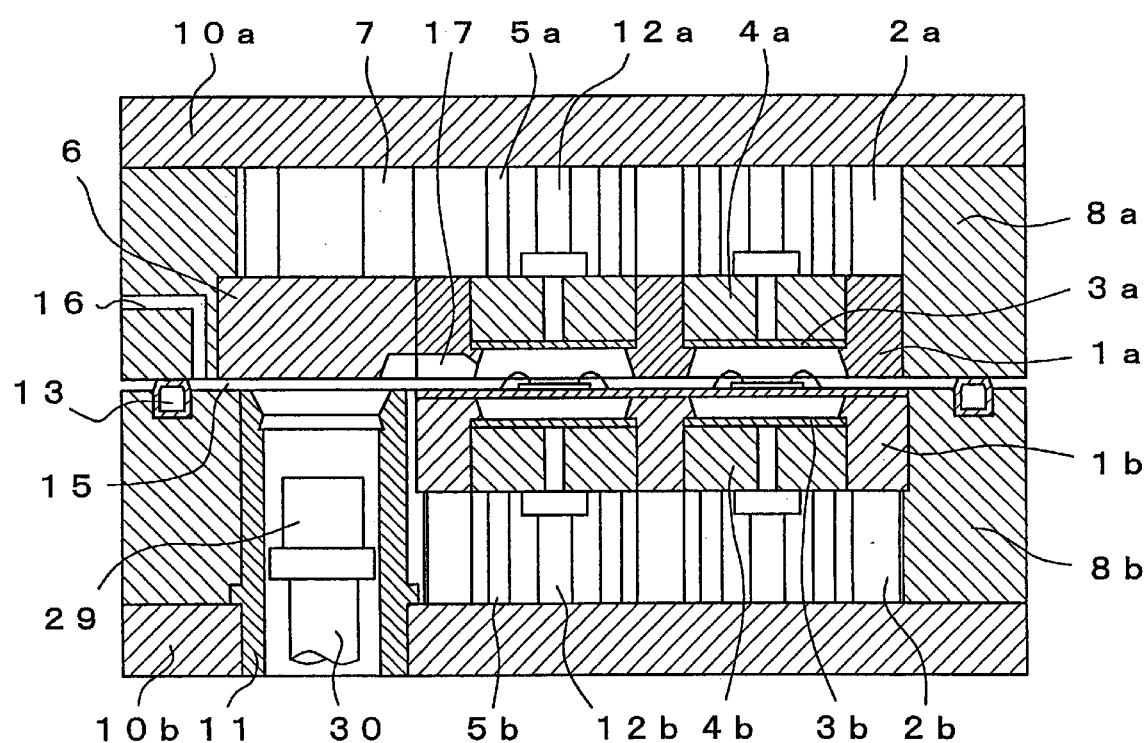
FIG. 2 is a cross-sectional view showing a state in which a vacuum evacuation is operated prior to clamping molds in accordance with Embodiment 1 of the present invention.
Figure 3:
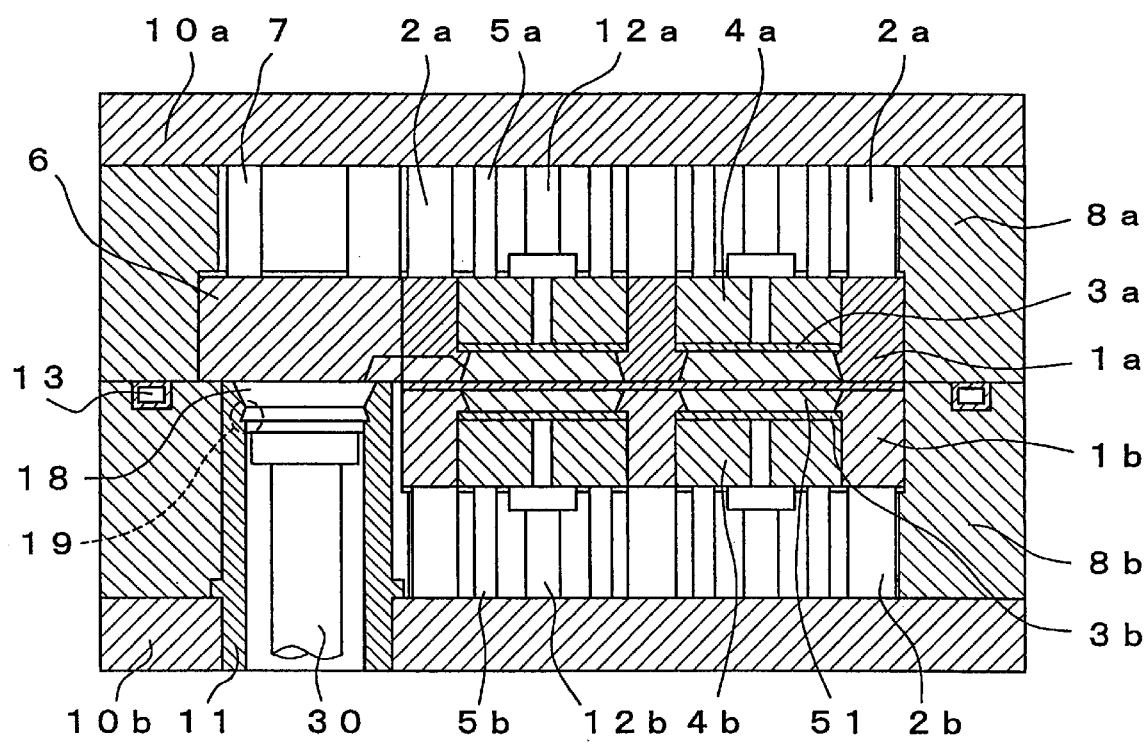
FIG. 3 is a cross-sectional view that shows a clamped state of the molds in accordance with Embodiment 1 of the present invention.
Figure 4:
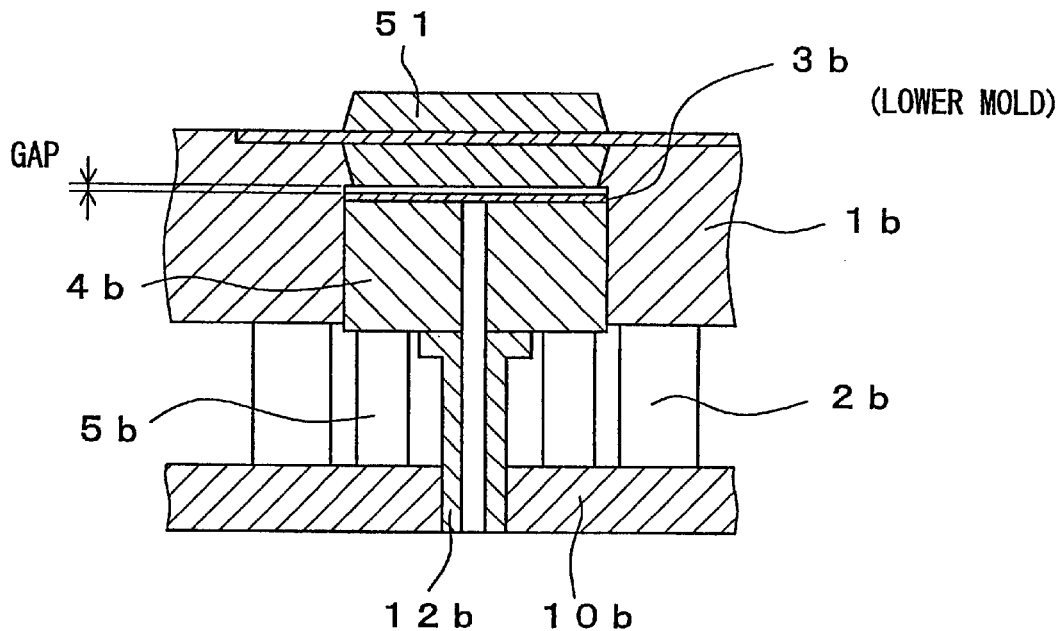
FIG. 4 is a cross-sectional view that shows an operational state in which a first stage of a mold-releasing process is carried out.
Figure 5:
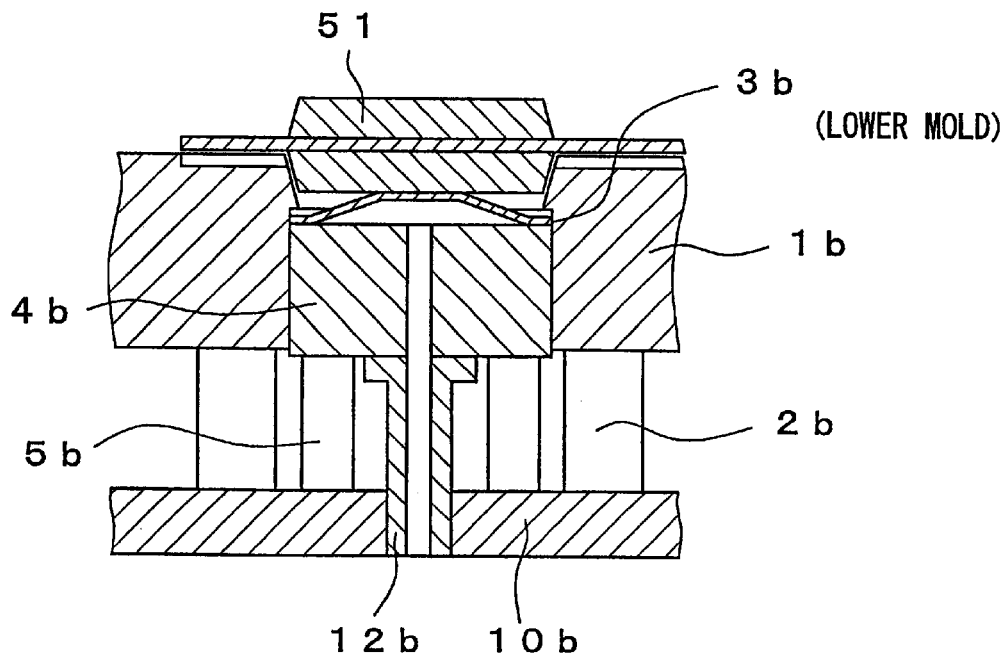
FIG. 5 is a cross-cross-sectional view that shows an operational state in which a second stage of a mold-releasing process is carried out.

Referring to FIG. 1, the following description will discuss one embodiment of the present invention. FIG. 1 is a cross-sectional view that shows a resin-sealing mold of a semiconductor device used in Embodiment 1 of the present invention. FIG. 2 is a cross-sectional view that shows a state in which a vacuum evacuation is operated prior to clamping the molds in Embodiment 1 of the present invention. FIG. 3 is a cross-sectional view that shows a clamped state of the molds in the Embodiment. FIG. 4 is a cross-sectional view that shows a first stage of a mold-releasing operation of the Embodiment. FIG. 5 is a cross-sectional view that shows a cross-sectional view that shows a second stage of the mold-releasing operation of the Embodiment.

Here, for convenience of explanation of the drawings, there are some portions in which hatching is omitted and other portions that are indicated by side views. For example, hatching is omitted from mold resin 29 and a plunger 30, and in FIG. 1, hatching is also omitted from second elastic posts 5a and 5b. In FIG. 2, first elastic posts 2a and 2b, second elastic posts 5a and 5b, and third elastic posts 7, and piping sleeves 12a and 12b are indicated as side views.

As illustrated in FIG. 1, the upper mold of a resin-sealing mold of a semiconductor device is constituted by a first cavity insert 1a, a first elastic post 2a, an elastic plate 3a, a second cavity insert 4a, a second elastic post 5a, a cull insert 6, a third elastic post 7, a retainer 8a, a cleaning pin 9, a packing plate 10a, a piping sleeve 12a, a cavity 14a and a vacuum evacuation hole 16.

The first cavity insert 1a forms a side face portion of the cavity 14a. The first elastic post 2a supports the first cavity insert 1a. The elastic plate 3a forms a bottom face portion of the cavity 14a that is built in the first cavity insert 1a. The second cavity insert 4a, which is built in the first cavity insert 1a, is allowed to shift in a mold-releasing direction. The second elastic post 5a supports the second cavity insert 4a.

The cull insert 6 is supported by the third elastic post 7. The retainer 8a that includes the first cavity insert 1a and the cull insert 6 is attached to the backing plate 10a. The cleaning pin 9 is allowed to stick out from the first cavity insert 1a so that residual resin on the first cavity insert 1a is removed, and also serves as an escape hole for a positioning pin 20 of the lower mold of the resin-sealing mold. To the backing plate 10a not only the retainer 8a but also the respective elastic posts 2a, 5a and 7 are attached. The piping sleeve 12a has its one end connected to the second cavity insert 4a, and the other end connected to an external air supply-discharge means (not shown). Moreover, the piping sleeve 12a penetrates the backing plate 10a.

An explanation is given of the lower mold of the resin-sealing mold of a semiconductor device also shown in FIG. 1. Here, with respect to those parts 1b to 5b, 8b, 10b, 12b and 14b having the same structures and functions as 1a to 5a, 8a, 10a, 12a and 14a of the above-mentioned upper mold of the semiconductor device, the explanation thereof is omitted.

The lower mold of the resin-sealing mold of a semiconductor device is constituted by a first cavity insert 1b, a first elastic post 2b, an elastic plate 3b, a second cavity insert 4b, a second elastic post 5b, a retainer 8b, a backing plate 10b, a chamber 11, a piping sleeve 12b, a seal 13, a cavity 14b and a positioning pin 20.

The chamber 11 is built in the retainer 8b and the backing plate 10b, and a groove is formed in the inner circumference thereof. A plunger 30, which is movable upward and downward, is placed inside the chamber 11. Molding resin 29 is placed on the plunger 30. The seal 13 has a void in its cross-section, and compressed air is supplied to the inside of the seal by an external air supply means (not shown). The positioning pin 20 is used so as to position the semiconductor element 22 to be resin-sealed that is installed on the lead frame 21.

Here, the seal 13 is attached to the lower mold; however, this may also be attached to the upper mold, or may be attached only to the upper mold. Moreover, the chamber 11 is built in the lower mold, and the cull insert 6 and the third elastic post 7 are built in the upper mold; however, the chamber 11 may be built in the upper mold, while the cull insert 6 and the third elastic post 7 may be built in the lower mold. Furthermore, the vacuum evacuation hole 16, which is formed in the upper mold, may be formed in the lower mold.

Next, an explanation will be given of a resin-sealing method of the semiconductor device. First, a frame-assembly (an integral part of the lead frame 21, semiconductor element 22 and bonding wire 23) is transported onto the upper face of the lower mold of the resin-sealing mold of FIG. 1 by an external transporting means (not shown), and this is pressed onto the positioning pin 20 so as to be placed at an appropriate position.

Then, the upper mold is allowed to descend, and stopped on the way at a vacuum evacuation position prior to clamping the molds (FIG. 2). At this time, compressed air is supplied to the inside of the ring-shaped seal 13 so that the seal 13 is expanded to contact the lower face of the upper mold, thereby forming a sealed space 15. Next, the external vacuum evacuation means (not shown) connected to the vacuum evacuation hole 16 vacuates the sealed space 15. After this has been reduced to a predetermined pressure, the lower face of the upper mold and the upper face of the lower mold are allowed to contact each other, thereby carrying out a final mold clamping process. Thus, the molds are completely made in contact with each other without unnecessary gaps. Upon clamping the molds, the first cavity inserts 1a and 1b are pressed by the lead frame 21, that is, the first elastic posts 2a and 2b are first shortened, and the second elastic posts 5a and 5b are then shortened.

Next, the plunger 30 is raised so that the mold resin 29 passes through a runner 17, and is injected into the cavities 14a and 14b; thus, a semiconductor resin package 51, that is, a resin-sealed semiconductor device, is formed (FIG. 3).

Here, both of the upper and lower resin-sealing molds are of course preliminarily heated to a high-temperature state by a heating means (not shown).

Moreover, upon forming the semiconductor resin package 51, the first cavity insert 1a and the cull insert 6 of the upper mold are supported by the respectively different elastic posts 2a and 7. That is, since they are supported in an independently floating state, they are positively allowed to contact the first cavity insert 1b and the chamber 11 even when there are deviations in the thickness of the frame. Therefore, there are not any thin burrs generated on the periphery of the semiconductor resin package 51 and in the vicinity of a cull section 18.

Next, after the upper and lower molds have been maintained (cured) for a predetermined time, the upper mold is raised. At this time, the first cavity insert 1a and the second cavity insert 4a are both lowered by the elastic strength of the elastic posts 2a and 5a. In contrast, the first cavity insert 1b and the second cavity insert 4b are both raised by the elastic strength of the elastic posts 2b and 5b.

Here, the amount of distortion of the first elastic post 2a is set to be greater than the amount of distortion of the second elastic post 5a. For this reason, the first cavity insert 1a is lowered to a greater degree as compared with the second cavity insert 4a, with the result that a gap is formed between the upper face of the semiconductor resin package 51 and the elastic plate 3a so that the upper mold and the semiconductor resin package 51 are separated from each other. In other words, even after the elastic post 5a has returned to its original length to stop extending, the elastic post 2a is still allowed to press the first cavity insert downward by its remaining recovery strength.

In the same manner, the amount of distortion of the first elastic post 2b is set to be greater than the amount of distortion of the second elastic post 5b. For this reason, the first cavity insert 1b is heightened to a greater degree as compared with the second cavity insert 4b, with the result that a gap is formed between the bottom face of the semiconductor resin package 51 and the elastic plate 3b so that the first stage of a mold-releasing process is carried out (FIG. 4). In this case also, even after the elastic post 5b has returned to its original length to stop extending, the elastic post 2b is still allowed to press the first cavity insert upward by its remaining recovery strength.

Upon opening the molds, the mold-releasing process of the first stage is carried out while a vacuum evacuation is being operated on the elastic plates 3a and 3b by the external air supply-discharge means (not shown) connected to the piping sleeves 12a and 12b. Therefore, since a vacuum evacuation is being operated on the elastic plates 3a and 3b, the semiconductor resin package 51 is easily released from the molds without adhering to the elastic plates 3a and 3b.

Next, compressed air, which is supplied by the external air supply-discharge means (not shown) through the piping sleeve 12b attached below the second cavity insert 4b, is applied onto the lower face of the elastic plate 3b through the second cavity insert 4b.

As illustrated in FIG. 5, the elastic plate 3b is distorted in a protruding manner by the compressed air, with the result that the bottom face of the semiconductor package 51 is raised so that a gap is formed between the side face of the semiconductor resin package 51 and the first cavity insert 1b; thus, the second stage of the mold-releasing process is carried out. The distortion of the elastic plates 3a and 3b in a protruding manner may be made by the compressed air, or may be made by a shape memory alloy.

As described above, each of the elastic plates 3a and 3b has a structure which is stopped from being distorted by the vacuum evacuation of the external air supply-discharge means, and also is distorted by the compressed air supplied by the air supply-discharge means.

The product, released from the resin-sealing mold as described above, has a plurality of successive semiconductor packages with successive molded resin pieces having a runner 17 shape. Thereafter, the molded resin pieces having the runner 17 shape are cut off by using a conventional method, and the semiconductor resin-sealing packages 51 are cut into respective pieces.

When, after the contact state of the upper and lower molds has been maintained for a predetermined period of time, the upper mold is raised, the cull section 18 is also in contact with the cull insert 6. In this state, although the cull section 18 is also raised upward in the same manner, the molded resin 29 is caught by an under cut 19 attached to the inner circumference of the chamber 11 so that the under cut 19 holds the rising movement so that the cull insert 6 and the cull section 18 are released from the mold. Thereafter, as the plunger 30 is raised, that is, as the cull drawing operation is carried out, the molded resin 29 remaining inside the chamber 11 including the cull section 18 is discharged out of the chamber 11. This residual molded resin 29 inside the chamber may be re-heated by a heating means (not shown), and used in a resin-sealing process of another semiconductor device.

Next, an explanation will be given of the external air supply-discharge means.

As described earlier, the external air supply-discharge means is connected to the piping sleeves 12a and 12b. The external air supply-discharge means is provided with a sensor (not shown) for detecting the pressure of compressed air injected to the piping sleeves 12a and 12b, and a valve (not shown) for stopping the injection of the compressed air when the pressure detected by the sensor is not more than a predetermined value. Therefore, for example, in the case when there is any damage on the elastic plate 3a or 3b, etc, and the compressed air leaks to the cavity 14a or 14b, the pressure of the injected compressed air has a drop so that the external air supply-discharge means stops the injection of the compressed air by the valve, thereby minimizing the leaked compressed air inside the cavity 14a or 14b. Thus, it is possible to prevent the compressed air from contaminating the clean room.

As described above, the present invention makes it possible to eliminate a number of eject pins and consequently to simplify the structure; therefore, it is possible to cut the mold manufacturing costs and also to shorten the mold manufacturing time. Moreover, since the mold-releasing process of the semiconductor package 51 is carried out in a separate manner using two steps, the mold-releasing process of thin-film packages which have been increasingly demanded in recent years can be carried out with less damages, thereby making it possible to improve the yield.

Moreover, since the cavity insert 1a and the cull insert 6 are allowed to have the independent floating structure, the molding process is free from adverse effects due to deviations in the frame thickness and varied precision in the individual molding parts, etc.; therefore, it is possible to completely prevent the generation of thin burrs. Consequently, it becomes possible to improve the quality, to provide stable mold-releasing and transporting processes, to increase the assembling operation rate, and also to improve the productivity.

Embodiment 2

In Embodiment 1, no description has been made as to the formation of a surface treated film that is placed in order to improve mold-releasing and abrasion resistant properties. Here, the resin-sealing mold may be provided with a film that is effective for surface treatment (a film of hard metal carbide of a transition element type, such as metal plating plus fluorine coating, WC, etc.), and this film may be used to form a contact face to the molding resin so as to carry out the second stage of the mold-releasing process. The other structures and operations are the same as those in Embodiment 1; therefore, the description thereof is omitted. Embodiment 2 has the same effects as those of Embodiment 1.

EMBODIMENT 3

The following description will discuss another Embodiment that relates to the second stage of the mold-releasing method.

In Embodiments 1 and 2, the elastic plate distortion system is used as the second stage of the mold-releasing method; however, the elastic plate 3b may be removed, and compressed air may be injected by the external air supply-discharge means (not shown) to the gap formed on the lower face of the semiconductor resin package 51 by the first stage of the mold-releasing process; thus, it is possible to carry out the second stage of the mold-releasing process.

Here, in order to prevent the mold resin from entering the piping sleeve 12b, and in order to prevent the compressed air from entering the cavity 14b except the injection time of the compressed air, it is preferable to install a valve between the cavity 14b and the piping sleeve 12b. Moreover, the upper mold of the resin-sealing mold may have the same structure so as to carry out the first stage of the mold-releasing process. The other structures and operations are the same as those in Embodiment 1; therefore, the description thereof is omitted.

Embodiment 4

The following description will discuss another Embodiment that relates to the second stage of the mold-releasing method.

Figure 6:
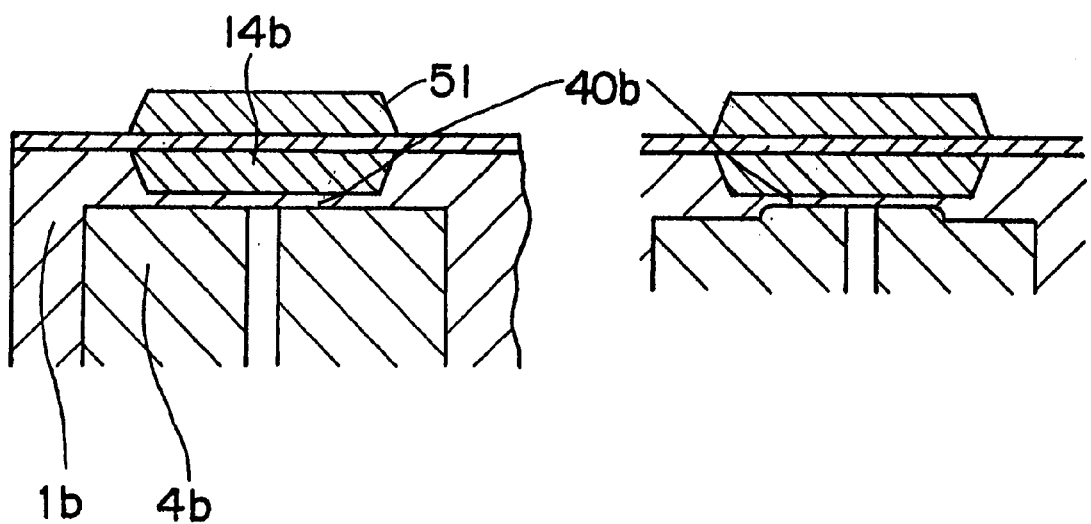
FIG. 6 is a cross-sectional view that shows one portion of a resin-sealing mold in accordance with Embodiment 4 of the present invention.
Figure 7:
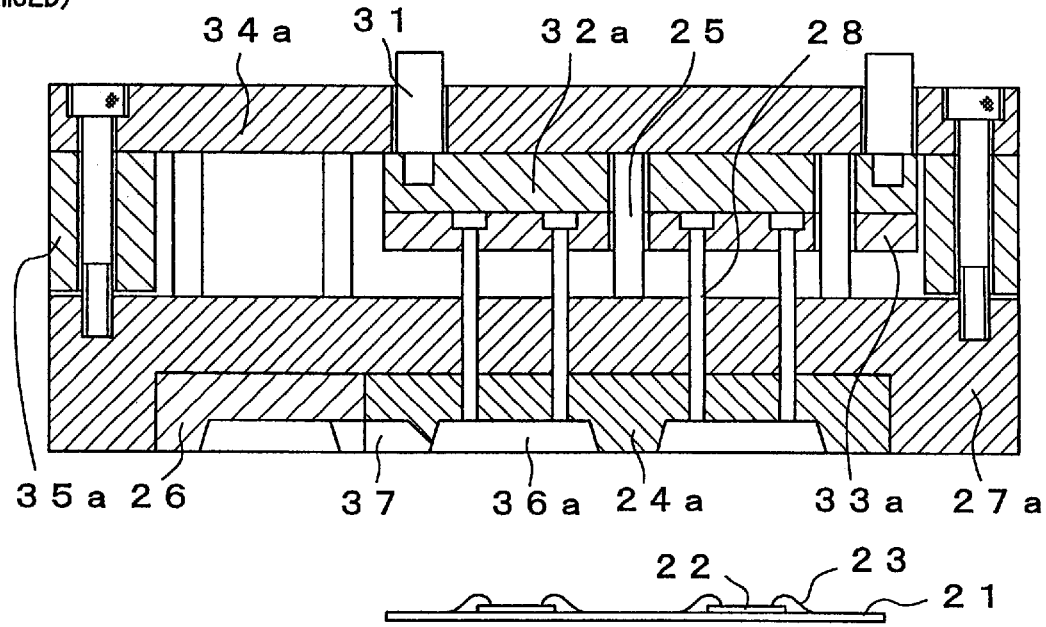
FIG. 7 is a cross-sectional view that shows a conventional resin-sealing mold.
Figure 7:
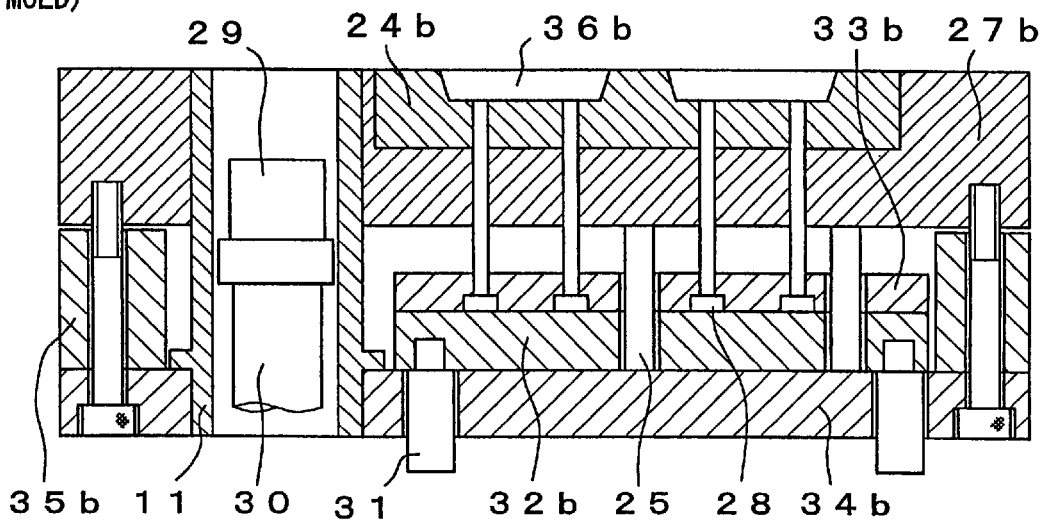
Figure 8:
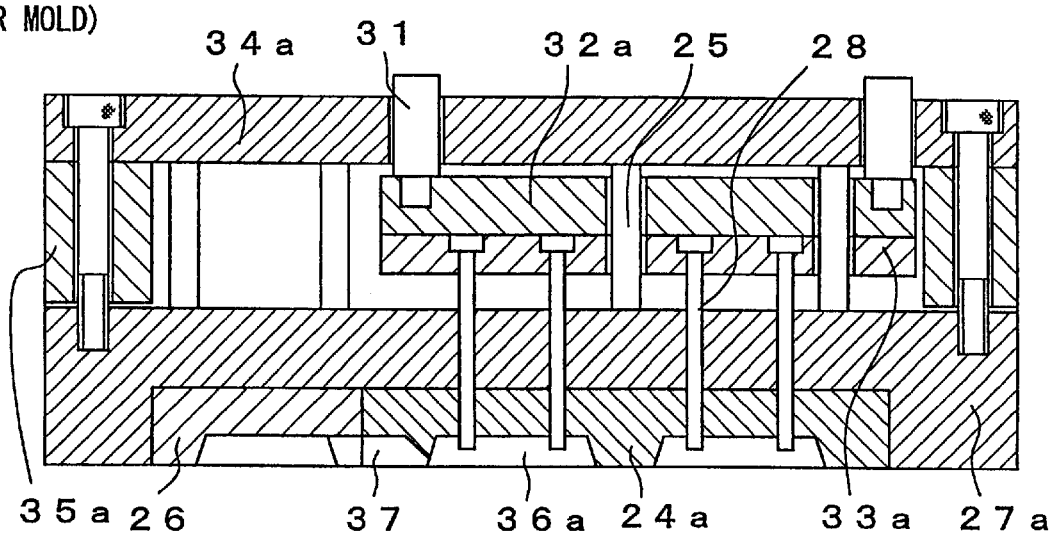
FIG. 8 is a cross-sectional view that shows a conventional resin-sealing mold.
Figure 8:
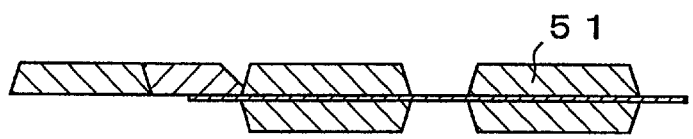
Figure 8:
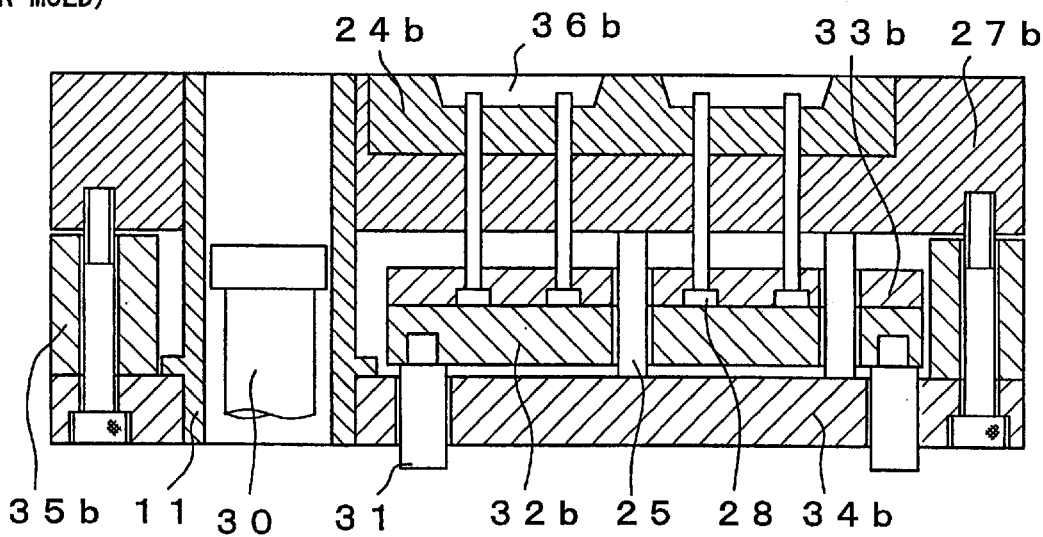

FIG. 6 is a cross-sectional view that shows one portion of a resin-sealing mold in accordance with Embodiment 4.

In Embodiment 1, the elastic plate distortion system is used as the second stage of the mold-releasing method; however, as illustrated in FIG. 6, the elastic plate 3b and the first cavity insert 1b may be integrated into one part. The first cavity insert 1b has a thin thickness portion 40b. Compressed air may be applied to this thin thickness portion 40b by the external air supply-discharge means (not shown) through the piping sleeve 12b so as to carry out the second stage of the mold-releasing process. This Embodiment has the same effects as those of the above-mentioned Embodiments. Here, with respect to the upper mold of the resin-sealing mold, the elastic plate 3a and the first cavity insert 1a may be integrated into one part in the same manner, and compressed air may be applied to the thin thickness portion so as to carry out the second stage of the mold-releasing process. The other structures and operations are the same as those in Embodiment 1; therefore, the description thereof is omitted.

What is claimed is:

1. A resin-sealing mold for encapsulating a semiconductor device in a resin comprising:
   an upper mold and a lower mold, for resin-sealing a semiconductor element on a lead frame, the upper and lower molds forming a cavity between them, wherein each of the upper and lower molds comprises:
   a first cavity insert forming a cavity side face portion;
   a first elastic post supporting the first cavity insert;
   an elastic plate, built in the first cavity insert, forming a cavity bottom portion;

a second cavity insert embedded at a position adjacent to the elastic plate on a side opposite the cavity;

a second elastic post supporting the second cavity insert;

a retainer retaining the first cavity insert and the second cavity insert; and a backing plate to which the first elastic post, the second elastic post, and the retainer are attached, and one of the upper mold and the lower mold comprises:
a cull insert adjacent to the first cavity insert; and
a third elastic post for supporting the cull insert, and the other of the upper mold and the lower mold comprises:
a chamber embedded in the retainer.

2. The resin-sealing mold for encapsulating a semiconductor device according to claim 1, wherein the first cavity insert and the second cavity insert move independently from each other.

3. The resin-sealing mold for encapsulating a semiconductor device according to claim 1, wherein the first elastic post supporting the first cavity insert is more easily distorted than the second elastic post supporting the second cavity insert.

4. The resin-sealing mold for encapsulating a semiconductor device according to claim 3, wherein, upon clamping the molds, the first elastic post is first compressed, and the second is elastic post is subsequently compressed, and, upon opening the molds, the second elastic post is first released from compression, and the first elastic post is subsequently released from compression.

5. The resin-sealing mold for encapsulating a semiconductor device according to claim 1, wherein a resin-sealed semiconductor device is released from the mold by distorting the elastic plate.

6. The resin-sealing mold for encapsulating a semiconductor device according to claim 1, wherein the upper mold has a piping sleeve for supplying compressed air to the elastic plate, and the elastic plate is distorted by compressed air supplied through the piping sleeve so that a resin-sealed semiconductor device is released from the mold.

7. The resin-sealing mold for encapsulating a semiconductor device
according to claim 1, wherein the chamber has a groove in an inner face, and, upon opening the mold, the cull insert and resin inside the chamber are separated from each other using the groove.

8. The resin-sealing mold for encapsulating a semiconductor device
according to claim 7, including a plunger in the chamber, wherein residual resin inside the chamber is separated from the mold using the plunger.

9. The resin-sealing mold for encapsulating a semiconductor device according to claim 1, wherein the first cavity insert and the cull insert move independently from each other.

10. The resin-sealing mold for encapsulating a semiconductor device according to claim 1, further comprising:
a seal placed on one of a lower face of the upper mold and an upper face of the lower mold; and
a vacuum evacuation hole communication with one of the lower face of the upper mold and the upper face of the lower mold and outside of the resin-sealing mold, wherein, in moving toward the lower mold, the upper mold is temporarily stopped so that a sealed space is formed between the lower face of the upper mold and the upper face of the lower mold by the seal, and, after a vacuum has drawn in the sealed space through the vacuum evacuation hole, the upper mold and the lower mold are clamped together.

11. The resin-sealing mold for encapsulating a semiconductor device according to claim 1 wherein the lower mold comprises a positioning pin for positioning the lead frame and the upper mold comprises a built-in cleaning pin in a hole that serves as an escape hole for the positioning pin upon clamping of the upper and lower molds together.

12. The resin-sealing mold for encapsulating a semiconductor device
according to claim 1, wherein each of the upper and lower molds has a piping sleeve for communication outside of the resin-sealing mold, and the elastic plate is distorted by a vacuum drawn through the piping sleeve and compressed air injected through the piping sleeve.

13. The resin-sealing mold for encapsulating a semiconductor device
according to claim 1, wherein the first cavity insert and the elastic plate have processed films on respective surfaces contacting a resin-molded semiconductor device.

14. The resin-sealing mold for encapsulating a semiconductor device according to claim 3, wherein the lower mold has a piping sleeve for communication outside of the resin-sealing mold, and the elastic plate is distorted by compressed air injected through the piping sleeve to release a resin-sealed semiconductor device from the mold.

15. The resin-sealing mold for encapsulating a semiconductor device according to claim 1, wherein each of the upper and lower molds has a piping sleeve for communication outside of the resin-sealing mold, and the elastic plate is distorted by compressed air injected through the piping sleeve to release a resin-sealed semiconductor device from the mold.

16. A resin-sealing mold for encapsulating a semiconductor device in a resin comprising:
an upper mold and a lower mold, for resin-sealing a semiconductor element on a lead frame, the upper and lower molds forming a cavity between them, wherein each of the upper and lower molds comprises:
a first cavity insert forming a cavity side face portion;
a first elastic post supporting the first cavity insert;
a second cavity insert forming a cavity bottom portion;
second elastic post supporting the second cavity insert;
a retainer retaining the first cavity insert and the second cavity insert; and
a backing plate to which the first elastic post, the second elastic post, and the retainer are attached, and one of the upper mold and the lower mold comprises:
a cull insert adjacent to the first cavity insert; and
a third elastic post for supporting the cull insert, and the other of the upper mold and the lower mold comprises:
a chamber embedded in the retainer.

17. A resin-sealing mold for encapsulating a semiconductor device in a resin comprising:
an upper mold and a lower mold, for resin-sealing a semiconductor element on a lead frame, the upper and lower molds forming a cavity between them, wherein each of the upper and lower molds comprises:
a first cavity insert forming a cavity side face portion and a cavity bottom portion;
first elastic post supporting the first cavity insert;
a second cavity insert embedded, on a side opposite to the cavity, at a position adjacent to a portion forming the cavity bottom portion that is one portion of the first cavity insert;

a second elastic post supporting the second cavity insert;

a retainer retaining the first cavity insert and the second cavity insert; and a backing plate to which the first elastic post, the second elastic post, and the retainer are attached, and one of the upper mold and the lower mold comprises:

a cull insert adjacent to the first cavity insert; and a third elastic post for supporting the cull insert, and the other of the upper mold and the lower mold comprises:

a chamber embedded in the retainer.

\* \* \* \* \*

UNITED STATES PATENT AND TRADEMARK OFFICE
CERTIFICATE OF CORRECTION

PATENT NO. : 6,530,764 B2  Page 1 of 1
DATED : March 11, 2003
INVENTOR(S) : Mishima et al.

It is certified that error appears in the above-identified patent and that said Letters Patent is hereby corrected as shown below:

<u>Title page,</u>
Item [73], Assignee add -- Mitsubishi Electric Engineering Company Limited. --

Signed and Sealed this

Second Day of September, 2003

JAMES E. ROGAN
*Director of the United States Patent and Trademark Office*